United States Patent
Dailey et al.

(10) Patent No.: US 6,555,015 B1
(45) Date of Patent: Apr. 29, 2003

(54) MULTI-LAYER PRINTED CIRCUIT BOARD AND METHOD OF MAKING SAME

(75) Inventors: Daniel Phillip Dailey, West Bloomfield, MI (US); Robert Edward Belke, Jr., West Bloomfield, MI (US); Jay DeAvis Baker, Dearborn, MI (US); Achyuta Achari, Canton, MI (US); Myron Lemecha, Dearborn, MI (US); Michael George Todd, South Lyon, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/712,838

(22) Filed: Nov. 9, 2000

Related U.S. Application Data

(62) Division of application No. 08/786,494, filed on Jan. 21, 1997.

(51) Int. Cl.$^7$ .................................................. H01B 13/00
(52) U.S. Cl. ............................................ 216/17; 216/19
(58) Field of Search ................................ 174/253, 255, 174/261; 361/748, 751, 772, 774, 809, 813; 257/786; 216/13, 14, 15, 17, 19

(56) References Cited

U.S. PATENT DOCUMENTS

| | | | |
|---|---|---|---|
| 3,801,388 A | | 4/1974 | Akiyama et al. |
| 4,052,787 A | | 10/1977 | Shaheen et al. |
| 4,404,059 A | | 9/1983 | Livshits et al. |
| 5,622,588 A | * | 4/1997 | Weber .......................... 156/263 |
| 5,900,674 A | * | 5/1999 | Wojnarowski et al. ...... 257/774 |
| 5,976,391 A | * | 11/1999 | Belke, Jr. et al. .............. 216/13 |
| 2001/0006115 A1 | * | 7/2001 | Goenka et al. ............. 174/255 |
| 2002/0003127 A1 | * | 1/2002 | Sakayori et al. .............. 216/95 |

* cited by examiner

Primary Examiner—Anita Alanko
(74) Attorney, Agent, or Firm—John E. Kajander

(57) ABSTRACT

Method of manufacturing a multi-layer printed circuit board adapted for reduce interfacial sheer stresses includes a laminate substrate having a top layer forming a first major surface, a middle layer having a predetermined thickness and a bottom layer forming a second major surface opposed to the first major surface. Etch resists are disposed on the first and second surfaces corresponding to reverse images of desired conductor patterns. The first and second surfaces are thereafter etched and the photoresist removed. The laminate substrate is secured via a low modules adhesive layer to a major surface of a base. The middle layer of the laminate substrate is thereafter selectively etched so as to isolate selected portions of the first and second surfaces and to define inner connect regions therebetween having a height equal to the predetermined thickness.

16 Claims, 7 Drawing Sheets

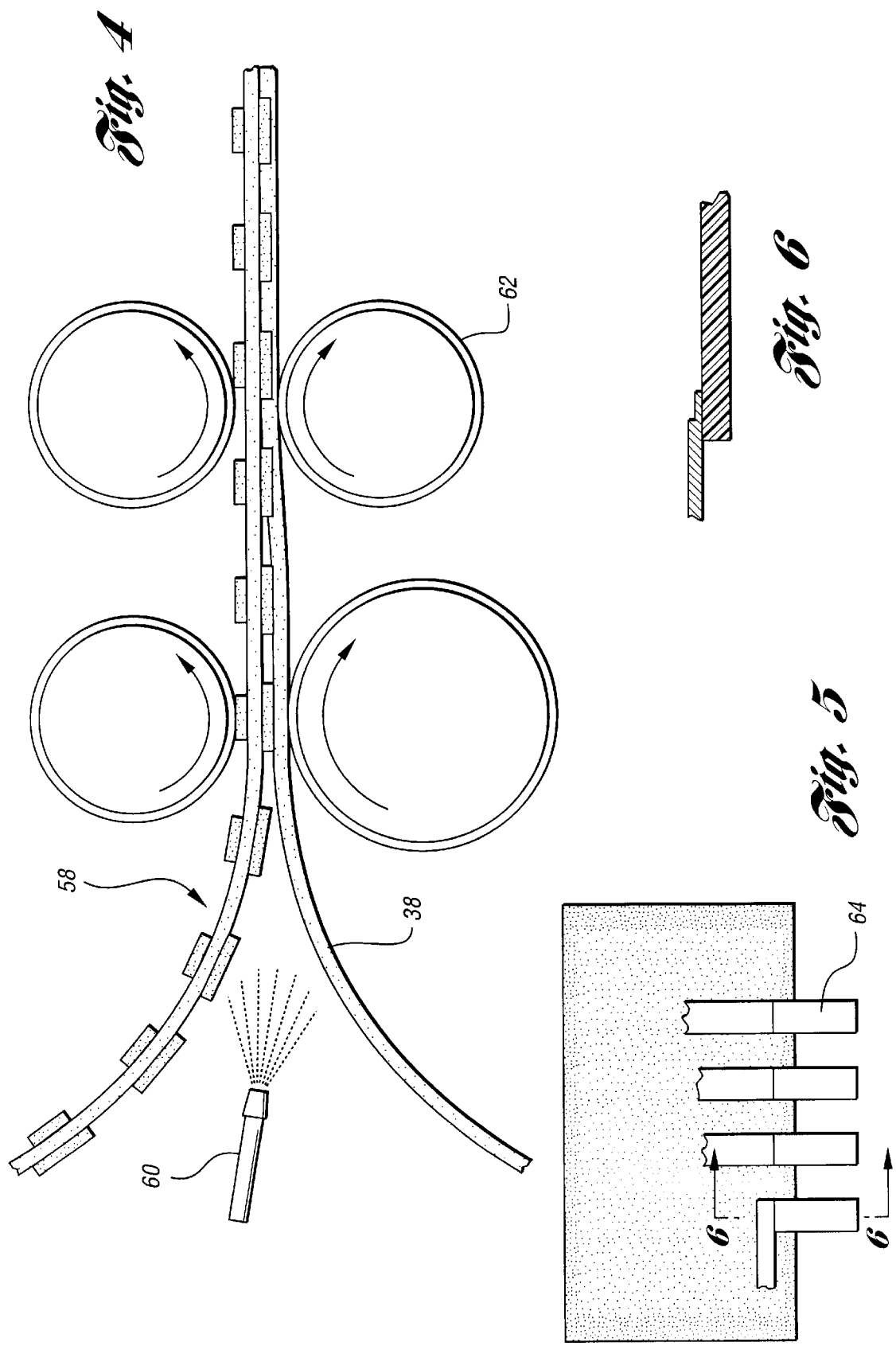

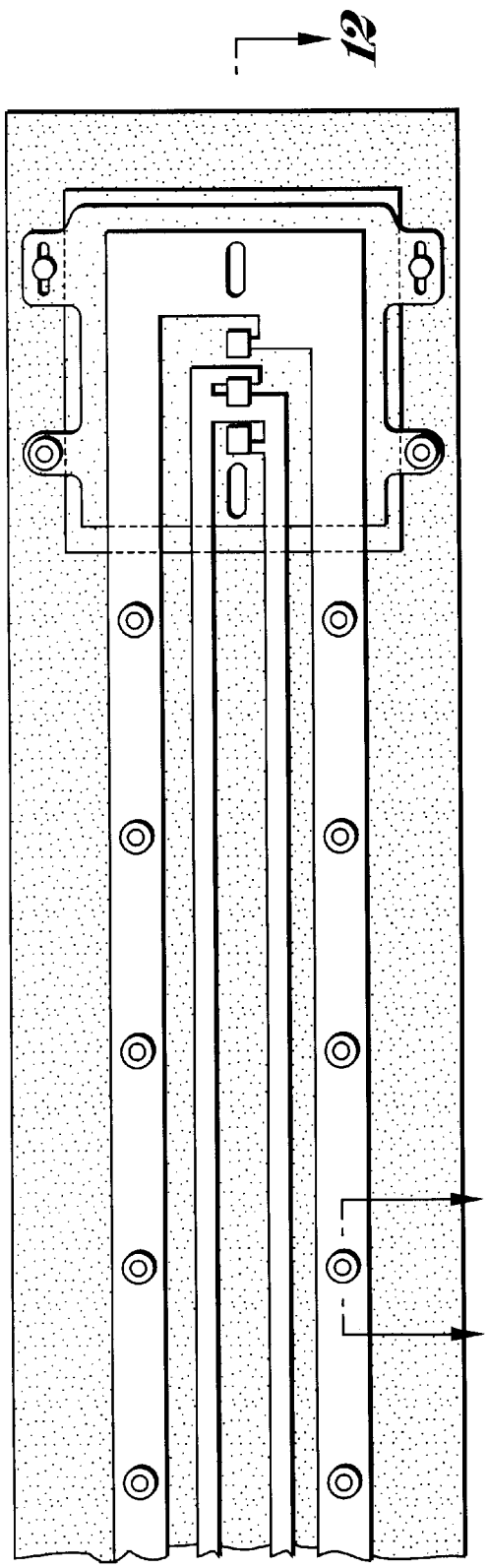
Fig. 11
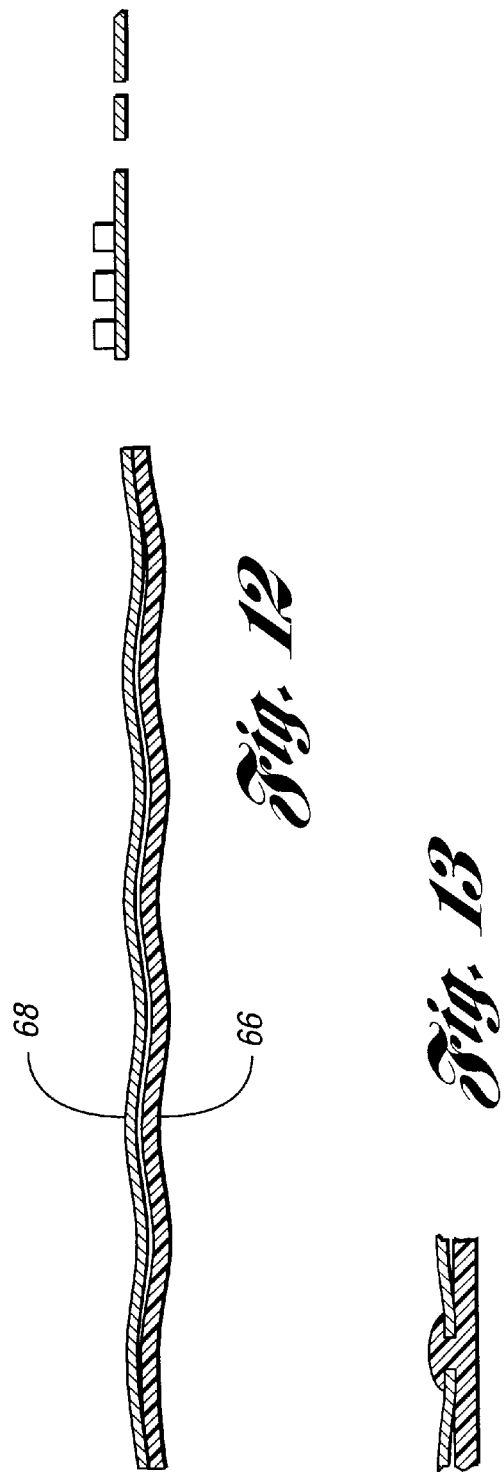
Fig. 12
Fig. 13

MULTI-LAYER PRINTED CIRCUIT BOARD AND METHOD OF MAKING SAME

"This is a divisional of application(s) Ser. No. 08/786,494 filed on 01/21/1997."

TECHNICAL FIELD

A multi-layer printed circuit board and a method of making the same having reduced interfacial shear stresses.

BACKGROUND ART

Multi-layer printed circuit boards, as the term has come to be known in the art, are used extensively today in an effort to reduce the size and number of chips, as well as external leads, required by complex microelectronic systems. The most commonly used multi-layer printed circuit board is a "double-sided" board having top and bottom metallic layers separated by a middle layer of metal or fiberglass-reinforced epoxy. Another type of circuit board may be considered in which both the top and bottom layers have conductor patterns formed on a middle metallic layer which are connected through the use of "air bridges" by selectively etching portions of the middle layer. The bottom layer, in turn, is typically affixed to a base material such as, for example, an epoxy glass substrate, generally referred to as FR4, or an aluminum base plate having a dielectric layer to prevent shorting.

A process for manufacturing such multi-layer printed circuit boards is shown in substantial detail in U.S. Pat. No. 4,404,059 issued to Livshits et al. Livshits teaches that conductor patterns may be formed into double-side printed circuit board through the use of an additive procedure referred to in the art as "RITM." As disclosed, conductor metal is electroplated onto opposed major surfaces of a substantially planar metal substrate through respective protective masks which correspond to the desired conductor pattern. The protective masks are typically photoresists which are applied by known two-side photolithography over the metal substrate. The conductor pattern on the first major surface includes bridging elements having enlarged ends and a constricting portion there between. The conductor pattern on the opposed major surface includes elements oriented transverse to the bridging elements.

After the outer conductors are electroplated on the middle metallic layer, the protected masks are removed and following a pre-etching step, an adhesive layer comprising an insulated material is secured to one major surface of the plated substrate such that it becomes embedded in one major surface of the adhesive layer. The other major surface of the adhesive layer is thereafter secured to a base. The entire substrate is then immersed into an etchant for a sufficient period of time to remove exposed portions of the substrate below the constricted portions of the bridging elements throughout the entire thickness of the substrate.

Livshits et al. suggests that a double-sided printed circuit board may also be formed by selectively removing conductor metal pre-applied over the entire surface of the substrate with the advantage that pre-fabricated bimetallic laminates prepared by metallurgical cladding techniques may be used. Livshits cautions, however, that the resulting conductors will suffer from the irregularity of edges and low produce ability of shape. Accordingly, the additive technique discussed above is proclaimed as more efficient from the standpoint of conductor metal consumption as well as the attainment of higher density of the conducting pattern of the panel.

While the use of multi-layer printed circuit boards formed by the process described above have greatly advanced the microelectronics art, they have nonetheless proven unreliable and thus undesirable in superintegration applications wherein the conductor layers have thermal expansion rates which differ from the thermal expansion rate of the plastic base.

Today, most of the microelectronics industry uses epoxy glass (FR4) as a base material because it has a thermal expansion rate, also called Coefficient of Thermal Expansion (CTE), of about 17 ppm degree Celsius. This means that for each degree Celsius, the material moves $17 \times 10^{-6}$ inches per inch. This is similar to the thermal expansion rate as copper, a metal typically used for the top and bottom conductors of the substrate. In automotive instrument panels, where large temperature swings are present, however, substantial interfacial shear stresses occur on the printed circuit board resulting in shorting.

More specifically, in these applications where temperature requirements are $-50°$ C. to $105°$ C., it is known that the plastic base will expand much more rapidly than the copper and even more rapidly than, for example, ceramic chips such as Ball Grid Arrays (BGA's) which have even lower rates of thermal expansion (on the order of 2–8 ppm degrees Celsius). Such mismatches have precluded the use of multi-layer printed circuit boards of the type described above for use in such applications.

Consequently, a need exists for an improved multi-layer printed circuit board and method of making the same having reduced interfacial shear stresses so as to be acceptable for use in applications with large temperature gradients.

DISCLOSURE OF THE INVENTION

It is an object of the present invention to provide a method of manufacturing an improved multi-layer printed circuit board adapted for reduced interfacial shear stresses.

In carrying out the above object, there is provided a laminate substrate having a top layer forming a first major surface, a middle layer having a predetermined thickness, and a bottom layer forming a second major surface opposed to the first major surface. Each of the layers comprises material etchable in a respective given etchant. Conductor patterns are thereafter etched on both the first and second surface by disposing respective etch resists (photoresists), each corresponding to a reverse image of a desired conductor pattern. Thereafter, the first and second surfaces are etched in the given etchant to form the first and second conductor patterns. The first and second etch resists are then removed.

According to the invention, a compliant adhesive layer comprising a low modulus material is then secured to the second surface so that the bottom layer becomes embedded in one major surface of the adhesive layer. The other major surface of the adhesive layer is thereafter secured to one major surface of a base. By selectively etching the middle layer in its corresponding etchant, the portions of the first and second surfaces are thereafter isolated and interconnect regions are defined therebetween having a height equal to the predetermined thickness of the middle layer.

In keeping with the invention, the low modulus material of the compliant adhesive layer and the thickness of the middle layer are selected such that their combination provides the reduced interfacial shear stresses.

In a preferred embodiment, the laminate substrate is substantially planar and is formed by known metallurgical cladding techniques. The base substrate is also preferably, but not necessarily, comprised of a plastic material for use on automotive instrument panels which may be subject to large temperature gradients. Other base materials such as, for example, flexible sheet metal, dielectric materials, ceramic glass, polyethylene film, MYLAR film, PET and other continuous and discontinuous composite materials may be used depending upon the desired application.

In carrying out the above method, a dual-layer printed circuit board is formed which is adapted for reduced interfacial shear stresses. The printed circuit board comprises a laminate substrate having a top layer, a middle layer and a bottom layer. The top layer forms a first major surface having a first conductor pattern formed thereon. The bottom layer forms a second major surface opposed to the first major surface and having a second conductor pattern formed thereon. The middle layer comprises a plurality of interconnect regions or thermal posts which separate isolated portions of the first and second surfaces.

The laminate substrate further includes a compliant adhesive layer comprised of a low modulus material having a first major surface secured to the second major surface of the substrate, and a second major surface. Finally, the printed circuit board includes a base, typically, but not necessarily, a plastic substrate, having a first major surface secured to the second major surface of the adhesive layer. Again, in keeping with the invention, the height of the thermal posts and the low modulus material of the adhesive layer are selected and combined so as to provide said reduced interfacial stresses.

These and other objects, features, and advantages of the present invention will become more readily apparent when viewed in connection with the accompanying drawings wherein like reference numerals correspond to like components.

BRIEF DESCRIPTION OF THE DRAWINGS

FIG. 4 is a schematic diagram illustrating the formation of a multi-layer printed circuit board in accordance with the present invention through a roll lamination process;

FIGS. 5–10 are schematic diagrams of lead frames formed in accordance with the teachings of the present invention;

FIGS. 11–13 are schematic diagrams of a preferred embodiment of a printed circuit board formed in accordance with the present invention wherein the base substrate is decoupled from flexible film to which the laminate substrate is adhered;

BEST MODE(S) FOR CARRYING OUT THE INVENTION

Figure 1A:
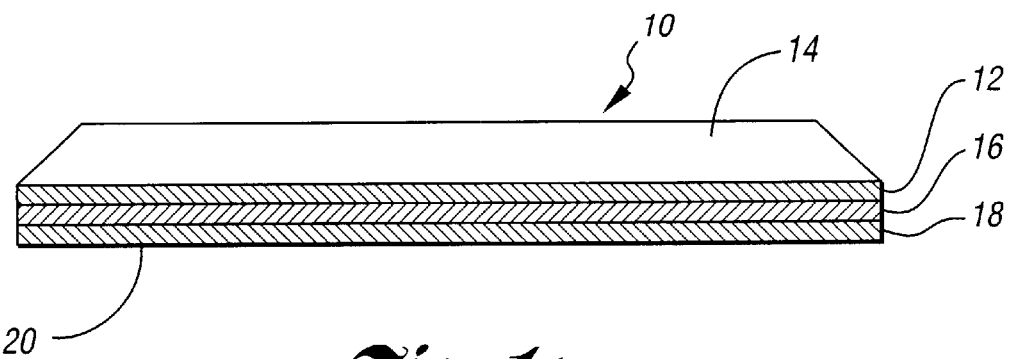
FIG. 1a–1d is a schematic diagram illustrating the manufacturing steps of the present invention.

Referring to FIG. 1 of the drawings, there is shown a schematic diagram illustrating the various manufacturing steps of the present invention. The invention incorporates a subtractive etching procedure carried out on a tri-layer laminate substrate shown in FIG. 1a. The laminate substrate, generally designated by reference numeral 10, is substantially planar and includes a top layer 12 forming a first major surface 14, a middle layer 16 having a predetermined thickness, and a bottom layer 18 forming a second opposed major surface 20.

Laminate substrate 10 is preferably, but not necessarily, formed by conventional metallurgical cladding techniques thus resulting in a tri-metallic layer substrate. In the schematic shown, top layer 12 and bottom layer 18 are understood, for exemplary purposes, as being comprised of copper, and the middle layer 16 is comprised of aluminum. In carrying out the invention, however, the layers of the laminate substrate need not be comprised of these specific materials. Nor is it necessary that the top and bottom layers be comprised of the same metallic material. Regardless of the materials selected for the layers, however, each layer must be comprised of a material etchable in a respective given etchant.

Figure 1B:
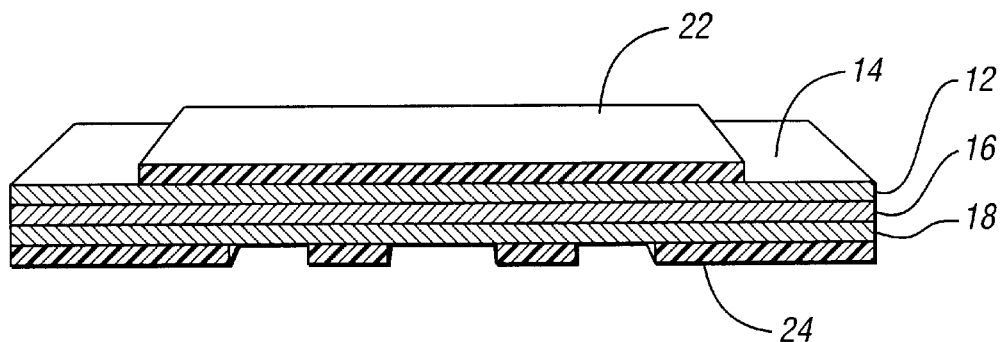

Referring now to FIG. 1b, a first etch resist (also called a photoresist) 22 is disposed on the first major surface 14 of layer 12. Etch resist 22 corresponds to a reverse image of a first desired conductor pattern. A second etch resist 24 is similarly disposed on second major surface 20 of bottom layer 18. The second etch resist 24 corresponds to a reverse image of a second desired conductor pattern.

Figure 1C:
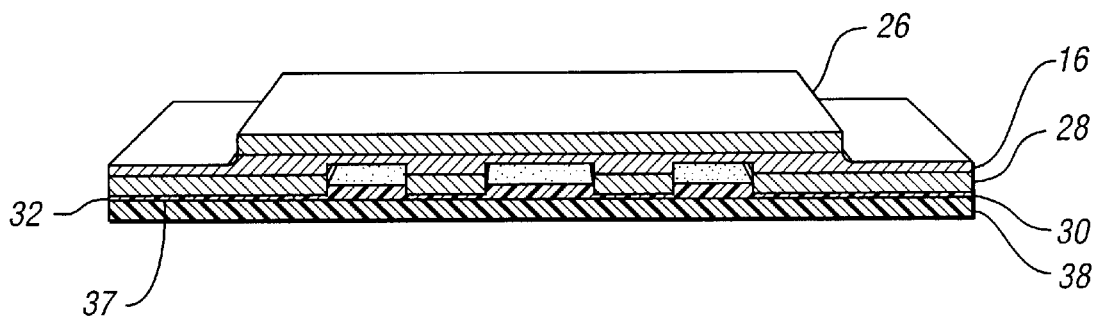

The first and second surfaces 14 and 20 are thereafter etched in their corresponding etchants. As shown in FIG. 1c, etch resists 22 and 24 are then removed leaving the unexposed portions 26 (below photoresist 22) of layer 12 and the unexposed portions 28 (below photoresist 24) of bottom layer 18 remaining. A compliant adhesive layer 30 is thereafter secured to the second surface 20 so that portions 28 of bottom layer 18 become embedded in one major surface 32 of adhesive layer 30. The other major surface of adhesive layer 30 is thereafter secured to a major surface 37 of a base 38.

In keeping with the invention, base 38 may be comprised of plastic for use in automotive instrument panels. Other materials may of course be utilized depending upon the desired application. It is thus anticipated that flexible sheet metal, ceramic glass, polyethylene film, PET, and dielectric materials as well as other continuous and discontinuous composite materials may be used.

Figure 1D:
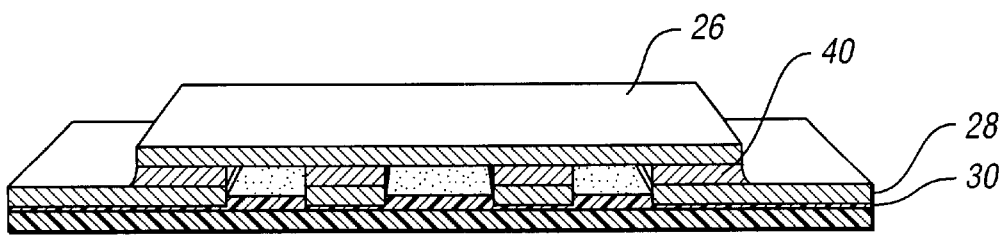

Turning now to FIG. 1d, middle layer 16 of laminate substrate 10 is thereupon selectively etched in its respective given etchant so as to isolate selected portions of the first and second surfaces and to further define interconnect regions, also termed "thermal posts" 40 having a height equal to the predetermined thickness of middle layer 16.

Figure 2:
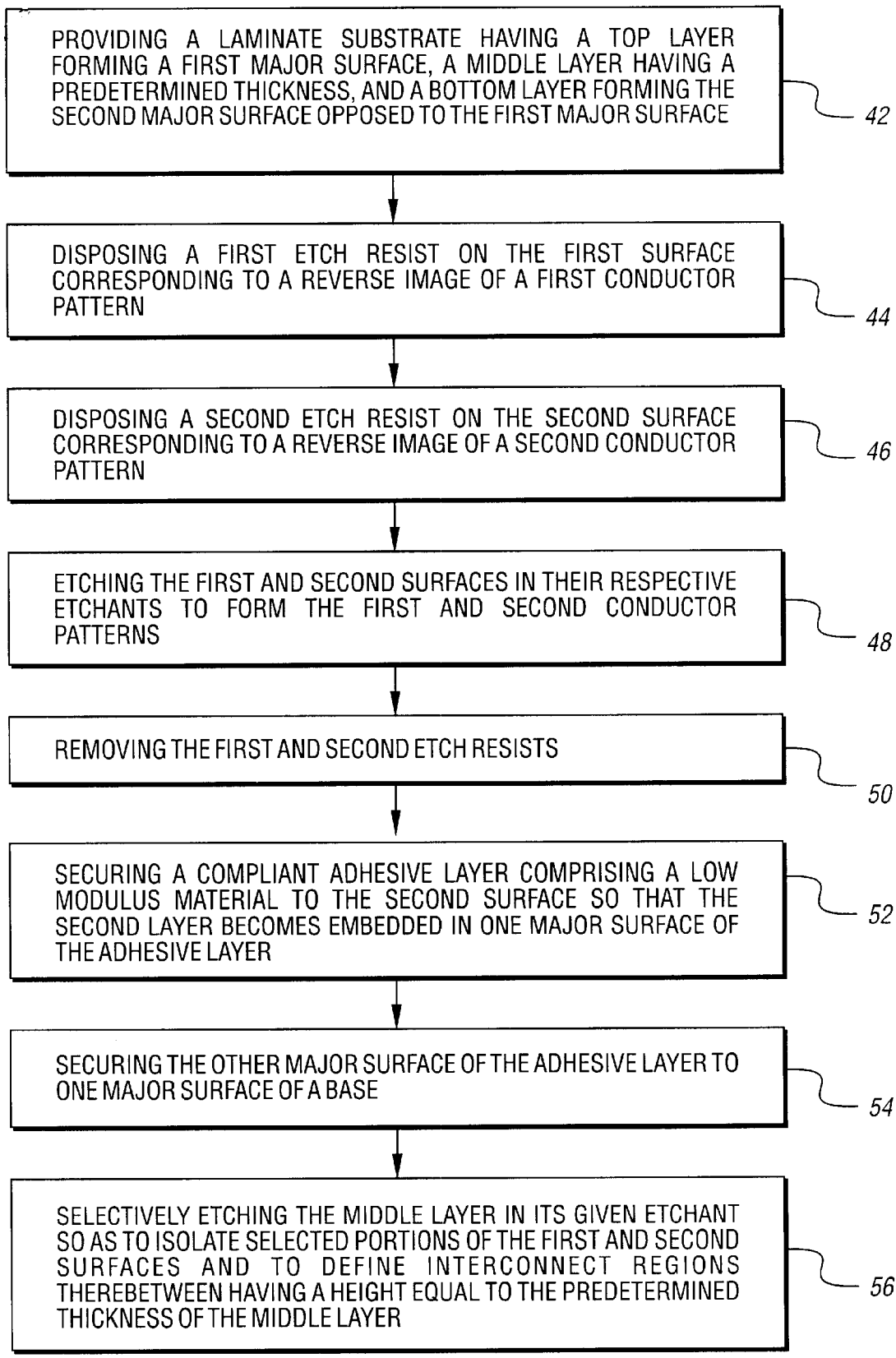
FIG. 2 is a flow diagram of the method steps of the present invention.

The above method steps may be more readily understood by reference to the block diagram of FIG. 2. As shown therein, the method includes the initial step of providing 42 a laminate substrate having a top layer forming a first major surface, a middle layer having a predetermined thickness, and a bottom layer forming a second major surface opposed to the first major surface. In keeping with the invention, each of the layers comprises a material etchable in a given etchant. Thereafter, a first etch resist is disposed 44 on the first surface corresponding to a reverse image of a first conductor pattern. A second etch resist is similarly disposed 46 on the second surface corresponding to a reverse image of a second conductor pattern.

The first and second surfaces are etched 48 in their respective given etchants to form the first and second conductor patterns. The first and second etch resists are thereafter removed 50. A compliant adhesive layer comprising a low modulus material is then secured 52 to the second surface so that the second layer becomes embedded in one major surface of the adhesive layer. The other major surface of the adhesive layer is thereafter secured 54 to one major surface of a base, typically comprising a plastic or other suitable material as discussed above. The middle layer is then selectively etched 56 in its given etchant so as to isolate selected portions of the first and second surfaces and to define interconnect regions therebetween having a height equal to the predetermined thickness of the middle layer.

In a preferred embodiment, adhesive layer 30 and base 38 are secured to each individual printed circuit board. It is contemplated, however, that printed circuit boards of the type described herein may be formed through continuous mass production techniques wherein very large laminate substrates are formed and later cut into individual printed circuit boards. In such cases, adhesive layer 30 and base 38 may be applied through a roll lamination process as shown, for example, in FIG. 4. In this embodiment, layer 16 and portions 26 and 28 of respective layers 12 and 18 are designated generally by reference numeral 58. Adhesive layer 30 may be sprayed on by applicator 60 and layers 58 may be roll laminated by heated lamination rollers 62 to a base material 38 as part of a continuous process.

In accordance with the invention, by varying the height of the interconnect (thermal post) 40, and selecting low modulus materials for the adhesive layer 30, the thermal expansion (CTE) differences between the base 38 and the electronic device (flip chips, integrated circuits, quad flap packs, VGAs, etc.) may be compensated for. The base 38 is coupled to the laminate substrate 10 either by means of in-molding or adhesive bonding. Typical thermal expansion rates for plastics range anywhere from 15 ppm/° C. for FR4 and SMC to over 100 ppm/° C. for many commodity and engineering thermoplastics such as polypropylene, PET, etc. Many of the electronic devices are composed of low CTE type materials, such as ceramics, which will have coefficients of thermal expansion ranging from 2 ppm/° C. to 15 ppm/° C. Operating temperatures and thermal shock requirements for many circuits can often be significant, thus making any thermal expansion differences between the plastic substrate and the electronic device an issue.

For example, as discussed above, automotive instrument panel temperature requirements are in the −50° C to 105° C. range or greater. A CTE mismatch of even as little as 10 ppm/° C. between the electronic device and the substrate over this temperature could result in interfacial shear stresses greater than 150 MPA, thus producing an interconnect failure. This is, of course, dependent on a number of factors, such as the size of the electronic device, the design of the leads (whether or not they are compliant), and the type of solder used in the design of the interconnects.

The present invention compensates for thermal expansion mismatches and thus reduces interfacial shear stresses to an acceptable level (without interconnect failure) by balancing the height of the interconnects with the use of low modulus compliant adhesive between the laminate substrate 10 and the base 38. As a result, larger electronic devices may be used over a broader temperature range without failure.

Figure 3:
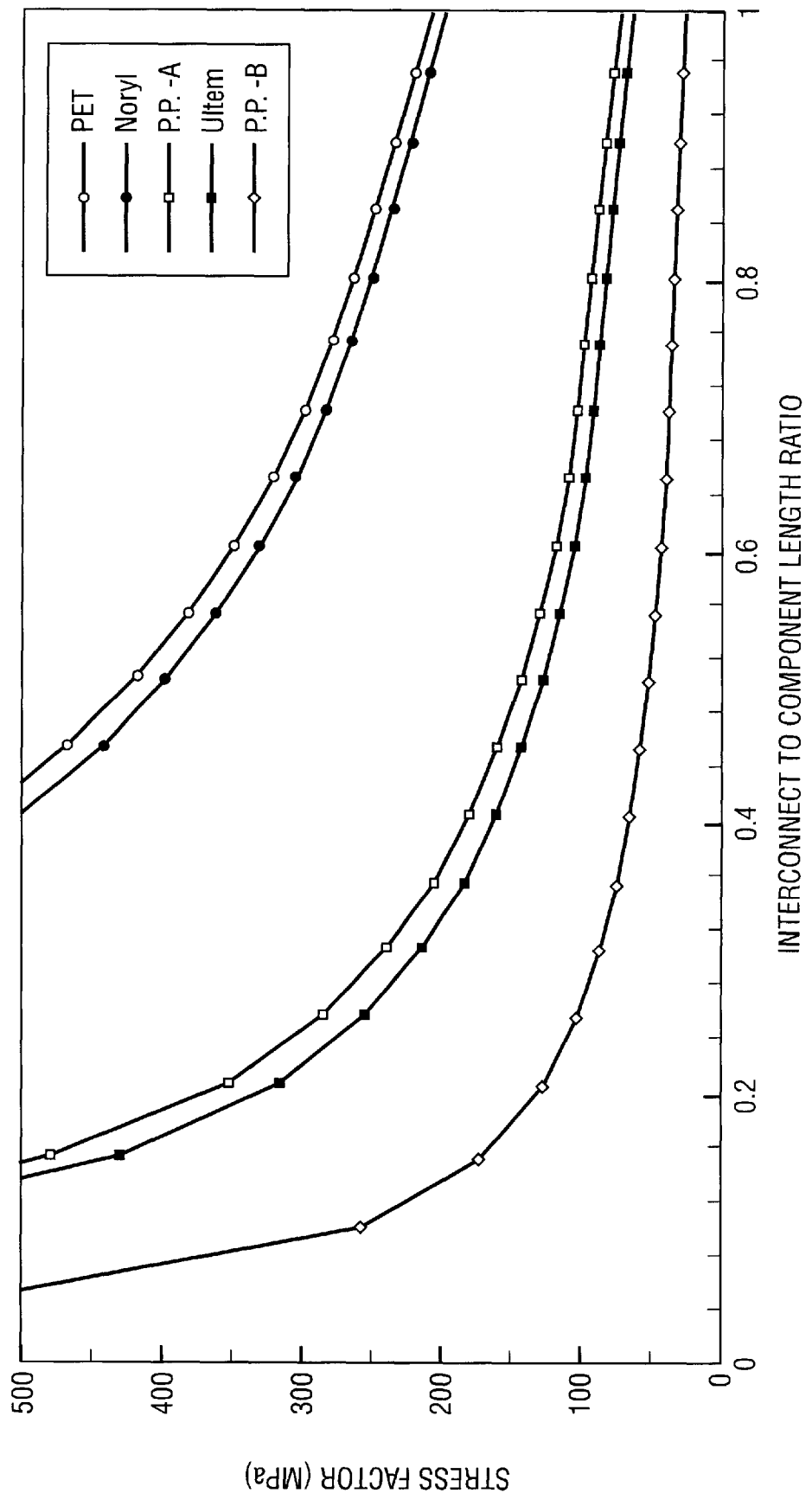
FIG. 3 is a schematic diagram illustrating the improved characteristics achieved by varying thermal post height with selected low modulus adhesive materials in accordance with the present invention.

Consider, for example, the relationship between stress factor (MPA) and interconnect height to component length ratio (for temperature range of −40° C. to 85° C.) shown in FIG. 3. It is known that most solder joints fail at approximately 150 mega pascals. In the example shown, PET plastic which has a coefficient of thermal expansion of 45 ppm/° C. and a stiffness of 5.5 GPA must have an interconnect height component length ratio of 20% or greater. NORYL, which is known to have a CTE of 41 (lower than PET plastic) and a stiffness of 2.1 (also lower than PET plastic), must have an interconnect height to component length ratio of approximately 40% or greater.

In the same chart, designated plastics "A" and "B" each having the same coefficient of thermal expansion (120 ppm/° C.)—substantially larger than PET and NORYL—are plotted. Plastic "A", however, has a greater stiffness (4 GPA) than plastic "B" (2.1). But for the difference in modulus, plastics "A" and "B" would have the same plot. However, plastic "B", which is comprised of a lower modulus material, exhibits improved characteristics and thus requires a slightly lower interconnect height to component length ratio.

As readily seen, the selection and combination of interconnect height and low modulus adhesive material may be used to create a multi-layer printed circuit board having improved characteristics and, in particular, reduced interfacial shear stresses. While these selections are left to the printed circuit board designer, the above-described method, which utilizes a subtractive etching method, has been found in practice to be far less expensive and thus commercially viable for achieving this purpose.

As those skilled in the art will recognize, laminate substrates formed by metallurgical cladding techniques are currently extremely inexpensive. Accordingly, the printed circuit board designer may easily specify and purchase laminate clad substrates having the desired middle layer thickness corresponding to the desired interconnect height. Fabrication of such components through an additive process, in contrast, results in substantial expense and has been found in practice not to be commercially viable.

As a further advantage of the present invention, the subtractive method described herein allows for interconnect features to be concurrently formed as part of the overall fabrication process. Consider, for example, lead frames generally designated by reference numeral 64 in FIGS. 5–10. Prior art processing techniques require that surface mount connectors, which constitute separate components, be affixed to the printed circuit board following fabrication. The subtractive method disclosed herein obviates this secondary step by allowing the connector elements to be formed as part of a selective etching process thereby saving substantial expense. These connector elements allow the printed circuit board to be connected to other components, other circuit boards, etc.

Figure 7:
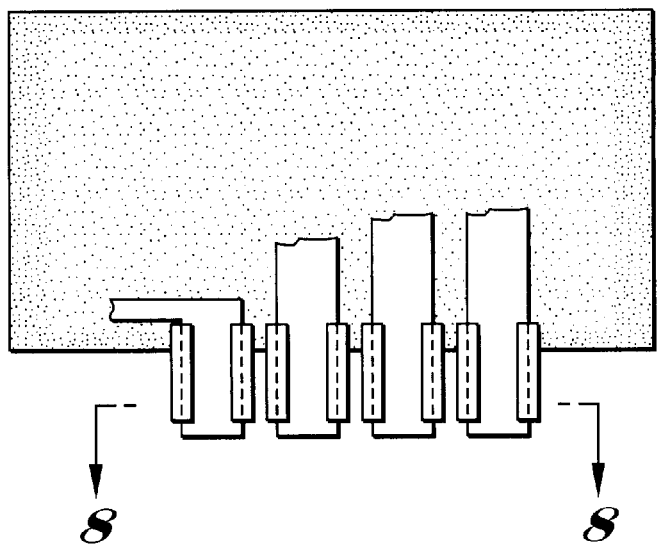
Figure 8:

A typical lead frame formed in accordance with the above subtractive method is shown in FIGS. 5–6. Lead frame 64 is formed by the selective placement of photoresist followed by the etching steps described above. As shown in FIGS. 7–8, base 38 may comprise, for example, a MYLAR film which may be placed in an injection tool and injection molded onto an instrument panel. As part of the tooling, the designer will allow for a portion of the plastic to overmold lead frame 64 as shown in the section view of FIG. 8. This overmolded portion acts as a stiffener. By forming the lead frames as part of the fabrication process, the designer may therefore take advantage of the injection molding process to add additional rigidity to the lead frames.

Figure 9:
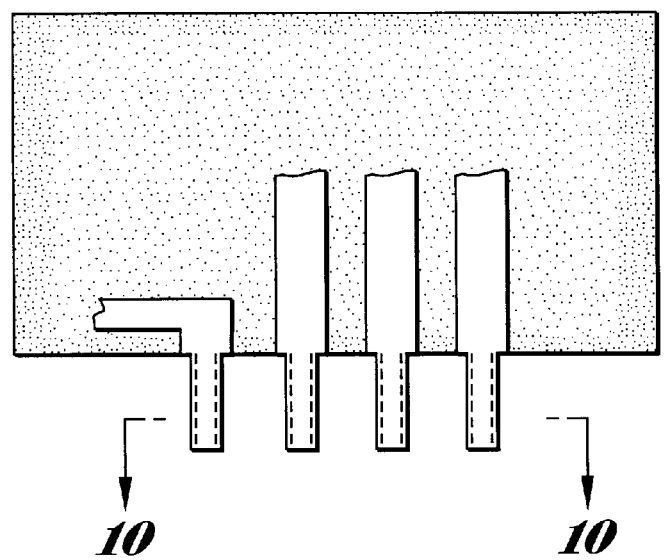
Figure 10:

Turning now to FIGS. 9–10 of the drawings, there is illustrated a secondary process which may be applied to lead frames 64 following fabrication wherein they are stamped to form a selected shape. Instead of being flat as shown in FIGS. 7–8, lead frames 64 are formed in a "C" shape so as to have a higher moment of inertia and thus greater stiffness. As readily seen, the circuit board designer therefore has the ability as a post processing step to bend or stamp lead frames 64 as necessary to achieve the desired shape having the desired stiffness.

FIGS. 11–13 illustrate a further ability of the discussed fabrication process to take advantage of thermal expansion issues. In FIG. 11, a circuit board formed in accordance with the teachings of the present invention is shown laminated to an instrument panel which, for exemplary purposes, shall be considered to have a very high rate of thermal expansion. Here, the plastic substrate 66 is shown mechanically coupled, i.e., affixed only at its end points, to flexible film 68. This permits the film to expand and contract as the printed circuit board heats up and cools without causing warping of the substrate 66.

Figure 14:
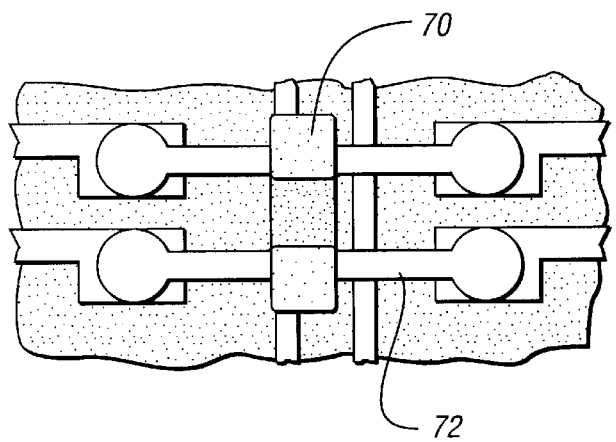
FIGS. 14–15 are schematic diagrams of a preferred embodiment of the present invention wherein surface mount components are affixed directly atop air bridges.
Figure 15:
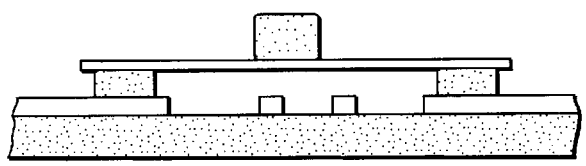
Figure 16:
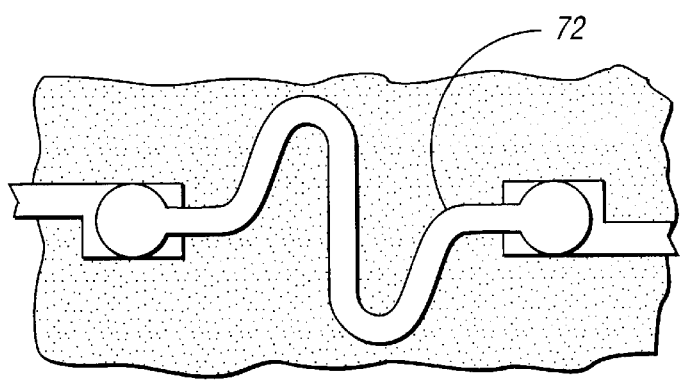
FIGS. 16–18 are schematic diagrams of an alternative embodiment of elevated air bridges formed in accordance with the present invention.
Figure 17:
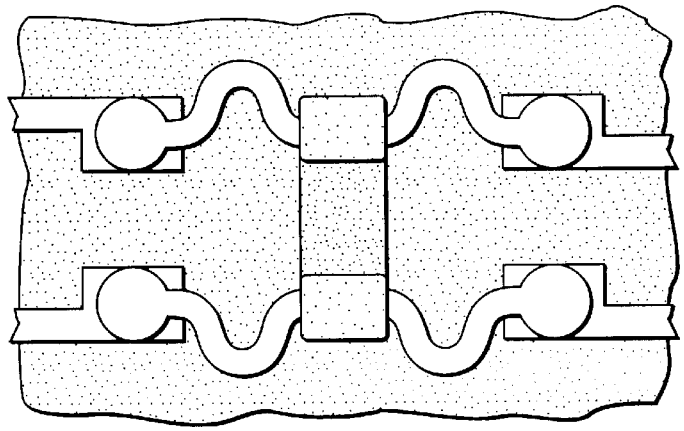
Figure 18:
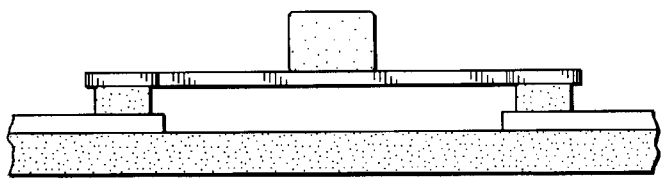

Turning now to FIGS. 14–15, it can be seen that as a feature of the present invention, surface mount components, such as component 70, may also be mounted directly on air bridges 72 as a means for further reducing interfacial stresses. Air bridge 72 may also be printed in accordance with the teachings of the present invention in a raised loop pattern, as shown in FIGS. 16–18. The loop design allows the air bridges a greater ability to spring, and thus further reduce the interfacial stresses of the component.

While the best modes for carrying out the invention have been described in detail, those familiar with the art to which this invention relates will recognize various alternative designs and embodiments for practicing the invention as defined by the following claims.

What is claimed is:

1. A method of manufacturing a printed circuit board having at least two conductor patterns and reducing interfacial shear stresses, comprising:

providing a laminate substrate having a top layer forming a first major surface, a middle layer having a predetermined thickness, and a bottom layer forming a second major surface opposed to the first major surface, each of the layers comprised of a material etchable in a respective given etchant;

disposing a first etch resist on the first surface corresponding to a reverse image of a first conductor pattern;

disposing a second etch resist on the second surface corresponding to a reverse image of a second conductor pattern;

etching the first and second surfaces in each said respective given etchant to form said first and second conductor patterns;

removing the first and second etch resists;

securing a compliant adhesive layer comprising a low modulus material to the second surface so that the bottom layer becomes embedded in one major surface of the adhesive layer;

securing the other major surface of the adhesive layer to one major surface of a base; and selectively etching the middle layer in said given etchant to isolate selected portions of the first and second surfaces and define interconnect regions therebetween having a height equal to said predetermined thickness;

wherein selecting the low modulus material and selecting the thickness of the middle layer are reducing interfacial shear stresses.

2. A method as in claim 1, wherein said laminate substrate is substantially planar.

3. A method as in claim 1, wherein said laminate substrate is formed by metallurgical cladding techniques.

4. A method as in claim 1, wherein the top layer of the laminate substrate is comprised of a first metallic material, the middle layer is comprised of a second metallic material, and the bottom layer is comprised of a third metallic material.

5. A method as in claim 1, wherein the top and bottom layers of the laminate substrate are comprised of a first metallic material and the middle layer is comprised of a second metallic material.

6. A method as in claim 1, wherein the top and bottom layers of the laminate substrate are comprised of nickel and the middle layer is comprised of copper.

7. A method as in claim 1, wherein the top and bottom layers of the laminate substrate are comprised of copper and the middle layer is comprised of aluminum.

8. A method as in claim 1, wherein the base is comprised of plastic.

9. A method as in claim 1, wherein the base is secured to the second surface via a roll lamination process.

10. A method as in claim 1, wherein the first conductor pattern includes an external lead frame.

11. A method as in claim 1, wherein the second conductor pattern includes an external lead frame.

12. A method as in claim 10, wherein the external lead frame is stamped to form a selected shape having a high moment of inertia.

13. A method as in claim 11, wherein the external lead frame is stamped to form a selected shape having a high moment of inertia.

14. A method as in claim 12 wherein the external lead frame is stamped in the shape of a "C".

15. A method as in claim 13, wherein the external lead frame is stamped in the shape of a "C".

16. A method as in claim 1, wherein the adhesive layer is secured to the base only at predetermined end points.

* * * * *